United States Patent
Gal et al.

(10) Patent No.: US 10,402,198 B2
(45) Date of Patent: Sep. 3, 2019

(54) SIGNAL PROCESSING DEVICE AND METHOD OF PERFORMING A PACK-INSERT OPERATION

(71) Applicants: Avi Gal, Raanana (IL); Fabrice Aidan, Ramat Hasharon (IL); Noam Eshel-Goldman, Tel-Aviv (IL); Roy Glasner, Kiryat Ono (IL); Dmitry Lachover, Holon (IL); Itay Peled, Hagor (IL)

(72) Inventors: Avi Gal, Raanana (IL); Fabrice Aidan, Ramat Hasharon (IL); Noam Eshel-Goldman, Tel-Aviv (IL); Roy Glasner, Kiryat Ono (IL); Dmitry Lachover, Holon (IL); Itay Peled, Hagor (IL)

(73) Assignee: NXP USA, Inc., Austin, TX (US)

( * ) Notice: Subject to any disclaimer, the term of this patent is extended or adjusted under 35 U.S.C. 154(b) by 211 days.

(21) Appl. No.: 14/897,787

(22) PCT Filed: Jun. 18, 2013

(86) PCT No.: PCT/IB2013/054994
§ 371 (c)(1),
(2) Date: Dec. 11, 2015

(87) PCT Pub. No.: WO2014/203034
PCT Pub. Date: Dec. 24, 2014

(65) Prior Publication Data
US 2016/0188331 A1     Jun. 30, 2016

(51) Int. Cl.
*G06F 9/30* (2018.01)
*H03M 13/27* (2006.01)
*H03M 13/00* (2006.01)

(52) U.S. Cl.
CPC ........ *G06F 9/3016* (2013.01); *G06F 9/30098* (2013.01); *H03M 13/2757* (2013.01); *H03M 13/6525* (2013.01)

(58) Field of Classification Search
None
See application file for complete search history.

(56) References Cited

U.S. PATENT DOCUMENTS

| 5,819,101 A | 10/1998 | Peleg et al. |
| 7,133,040 B1 | 11/2006 | Abdallah et al. |

(Continued)

OTHER PUBLICATIONS

International Search Report and Written Opinion correlating to PCT/IB2013/054994 dated Feb. 25, 2014.

*Primary Examiner* — John M Lindlof

(57) ABSTRACT

A signal processing device comprising at least one control unit arranged to receive at least one pack-insert instruction, decode the received at least one pack-insert instruction, and output at least one pack-insert control signal in accordance with the received pack-insert instruction. The signal processing device further comprising at least one pack-insert component arranged to receive at least a first data block to be inserted into a sequence of data blocks to be output to at least one destination register, receive a plurality of further data blocks to be packed within the sequence of data blocks to be output to the at least one destination register, arrange the at least first data block and the plurality of further data blocks into a sequence of data blocks based at least partly on the at least one pack-insert control signal, and output the sequence of data blocks.

16 Claims, 5 Drawing Sheets

(56) References Cited

U.S. PATENT DOCUMENTS

| | | |
|---|---|---|
| 7,219,215 B2 | 5/2007 | Ford et al. |
| 2002/0040427 A1* | 4/2002 | Symes ................ G06F 9/30025 712/221 |
| 2002/0078011 A1 | 6/2002 | Lee et al. |
| 2005/0204117 A1* | 9/2005 | Carpenter ........... G06F 9/30018 712/224 |
| 2007/0106882 A1 | 5/2007 | Thornton |
| 2009/0182982 A1 | 7/2009 | Greiner et al. |
| 2012/0198210 A1 | 8/2012 | Peleg et al. |

* cited by examiner

SIGNAL PROCESSING DEVICE AND METHOD OF PERFORMING A PACK-INSERT OPERATION

FIELD OF THE INVENTION

This invention relates to a signal processing device and a method of performing a pack-insert operation within a signal processing device.

BACKGROUND OF THE INVENTION

The increased data rate for the fourth generation (4G) of mobile telecommunications technology requires increased digital signal processor (DSP) performance. Examples of operations required to be performed by a mobile telecommunication DSP include byte to any byte mapping, such as required for performing interleaving, de-interleaving and insertion of rank information, etc.

Conventionally, in order to implement any byte to any byte mapping a butterfly and reverse butterfly schematic is required. FIG. 1 illustrates an example of a butterfly and reverse butterfly schematic for performing any byte to any byte mapping. The implementation of the butterfly method is complicated due to each stage of the butterfly method being different. The implementation of a 16 byte butterfly can be in one of two options:

(i) four different instructions (one per stage) requiring 8 cycles to complete; or
(ii) one instruction to implement all stages (such an instruction requiring 32×2 control bits, which is not possible under common instruction rules, and using 8 multiplexers in a row, that may impact timing).

Furthermore, the definition of the required control settings per the required bit mapping is very complex and typically requires the use of external programming assistance.

Traditional implementations (based on the first of the above options) suffer from poor performance for the increased data rate required for 4G technology due to the large number of separate pack, insert-extract and permute instructions that are required to be executed within traditional DSPs.

FIG. 2 illustrates an example of performing an LTE (Long Term Evolution) channel interleaving (Qm=6) procedure using conventional pack, insert-extract and permute instructions. An example of the corresponding instructions is provided below:

ld.2l (r0)+,d0:d1; load 8 bytes (2 longs) from A
ld.2l (r1)+,d8:d9; load 8 bytes from B
pack.w.2w d1.h,d8.h,d1; pack d1.h and d8.h to d1
pack.w.2w d8.l,d9.h,d2
st.2l d0:d1,(r2)+; store 8 bytes to dest0
st.l d2,(r2); store 4 bytes to dest0
ld.l (r0),d2; load 4 bytes from A
ld.l (r1),d10; load 4 bytes from B
pack.w.2w d1.l,d2.h,d8
pack.w.2w d2.l,d9.l,d9
st.2l d8:d9,(r3)+; store 8 bytes to dest1
st.l d10,(r3); store 4 bytes to dest1

In this example interleaving procedure, two "insert and pack" operations are required to be performed. The procedure starts with two load instructions for loading data into source registers, as illustrated at 200 and 205. Two separate 'pack' instructions are then required; the first pack instruction, illustrated at 210, inserts a first data block into destination registers, whilst the second pack instruction, illustrated at 215 packs a plurality of further data blocks into the destination registers after the first data block. Two store instructions are then executed to store the content of the destination registers, as illustrated at 220 and 225. The second "insert and pack" operation is then performed, starting with two load instructions for loading data into source registers, as illustrated at 230 and 235. Two separate 'pack' instructions are then required; the first pack instruction, illustrated at 240, packs an initial plurality of data blocks into destination registers, whilst the second pack instruction, illustrated at 245 inserts a further data block into the destination registers after the initial plurality of data blocks. Two store instructions are then executed to store the content of the destination registers, as illustrated at 250 and 255.

SUMMARY OF THE INVENTION

The present invention provides a signal processing device and a method of performing a pack-insert operation within a signal processing device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
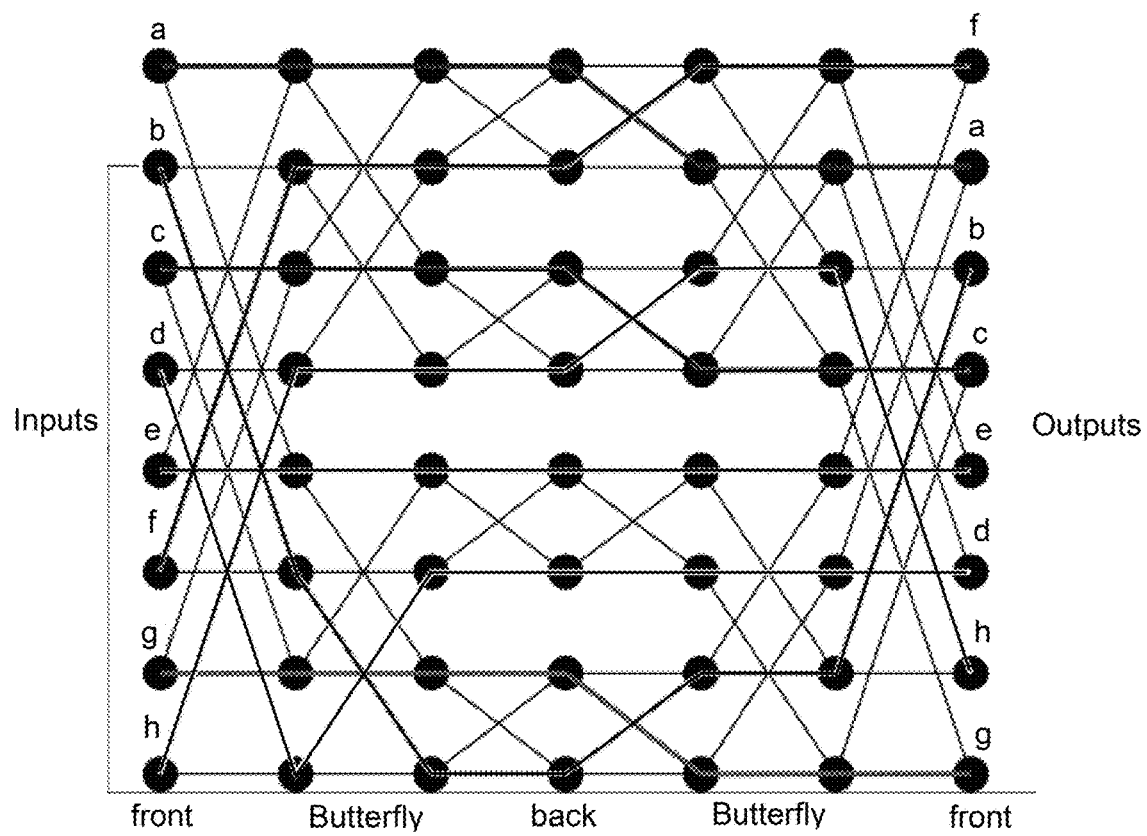
FIG. 1 illustrates an example of a butterfly and reverse butterfly schematic for performing any byte to any byte mapping.

The present invention will now be described with reference to the accompanying drawings in which examples of a signal processing device and a method of performing a pack-insert operation within a signal processing device are illustrated. However, it will be appreciated that the present invention is not limited to the specific embodiments herein described and illustrated in the accompanying drawings. Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

In some examples of a first aspect of the present invention, there is provided a signal processing device comprising at least one control unit arranged to receive at least one pack-insert instruction, decode the received at least one pack-insert instruction, and output at least one pack-insert control signal in accordance with the received pack-insert instruction. The signal processing device further comprising at least one pack-insert component arranged to receive at least a first data block to be inserted into a sequence of data blocks to be output to at least one destination register, receive a plurality of further data blocks to be packed within the sequence of data blocks to be output to the at least one destination register, arrange the at least first data block and the plurality of further data blocks into a sequence of data blocks based at least partly on the at least one pack-insert control signal, and output the sequence of data blocks.

In this manner, the pack-insert instruction and execution thereof within the signal processing device enables the insertion and packing of the first and plurality of further data blocks to be combined into a single instruction, reducing the number of instructions required to be executed when performing any byte to any byte mapping, such as required for performing interleaving, de-interleaving and insertion of rank information required in, say, communication standards such as LTE/LTE-A, WCDMA, WiMAX, etc. Furthermore, the proposed pack-insert instruction also enables the use of wide load and store instructions, as opposed to the need to use multiple loads and stores in the conventional implementation.

In one optional embodiment, the at least one pack-insert control signal may comprise at least one insert location signal identifying at least one location within the sequence of data blocks to be output to the at least one destination register at which the at least first data block is to be inserted, and the at least one pack-insert component is arranged to arrange the at least first data block and the plurality of further data blocks into a sequence of data blocks such that the at least first data block is located within the sequence of data blocks in accordance with the at least one insert location signal.

In one optional embodiment, the at least one pack-insert component may be arranged to receive at least a part of at least one source register value comprising the at least first data block to be inserted into the sequence of data blocks to be output to the at least one destination register, and selectively extract the at least first data block from the received at least part of the at least one source register value based at least partly on the received at least one pack-insert control signal.

In one optional embodiment, the at least one pack-insert control signal may comprise at least one insert data block identifier signal identifying at least one location within the received at least part of the at least one source register value comprising the at least first data block, and the at least one pack-insert component is arranged to selectively extract the at least first data block from the received at least part of the at least one source register value comprising the at least first data block based at least partly on the at least one insert data block identifier signal.

In one optional embodiment, the at least one pack-insert component may be arranged to receive at least a part of at least one source register value comprising the plurality of further data blocks to be packed within the sequence of data blocks to be output to the at least one destination register, and selectively extract the plurality of further data blocks from the received at least part of the at least one source register value based at least partly on the received at least one pack-insert control signal.

In one optional embodiment, the at least one pack-insert control signal may comprise at least one pack data identifier signal identify at least one location within the received at least part of the at least one source value comprising the plurality of further data blocks from which the plurality of further data blocks are to be extracted, and the at least one pack-insert component is arranged to selectively extract the at plurality of further data blocks from the received at least part of the at least one source register value comprising the plurality of further data blocks based at least partly on the at least one pack data identifier signal.

In one optional embodiment, the signal processing device may further comprise at least one source register select component arranged to selectively couple the at least one pack-insert component to at least one source register in accordance with the at least one pack-insert control signal, and the at least one pack-insert component is arranged to receive the at least first data block and the plurality of further data blocks from the at least one source register selectively coupled thereto by the at least one source register select component.

In one optional embodiment, the signal processing device may further comprise at least one destination register select component arranged to selectively couple the at least one pack-insert component to at least one destination register in accordance with the at least one pack-insert control signal, and the at least one pack-insert component is arranged to output the sequence of data blocks to the at least one destination register selectively coupled thereto by the at least one destination register select component.

In one optional embodiment, the at least one control unit may be arranged to receive and decode at least one pack-insert instruction comprising at least one value from a group comprising at least one of:
at least one insert location field;
at least one insert data block identifier field;
at least one pack data identifier field;
at least one insert data block source register address field;
at least one pack data source register address field; and
at least one destination register address field,
wherein the at least one control unit may be further arranged, upon decoding of the at least one pack-insert instruction, to output at least one pack-insert control signal comprising at least one of:
at least one insert location control signal;
at least one insert data block identifier control signal;
at least one pack data identifier control signal;
at least one insert data block source register address control signal;
at least one pack data source register address control signal; and
at least one destination register address control signal.

In one optional embodiment, the at least first block of data may comprise one of a byte of data, and a word comprising at least two bytes of data.

In one optional embodiment, the signal processing device may be implemented within an integrated circuit device comprising at least one die within a single integrated circuit package.

In some examples of a second aspect of the present invention, there is provided a method of performing a pack-insert operation within a signal processing device. The method comprises receiving at least a first data block to be inserted into a sequence of data blocks to be output to at least one destination register, receiving a plurality of further data blocks to be packed within the sequence of data blocks to be output to the at least one destination register, arranging the at least first data block and the plurality of further data blocks into a sequence of data blocks based at least partly on the received at least one pack-insert control signal, and outputting the sequence of data blocks.

Figure 3:
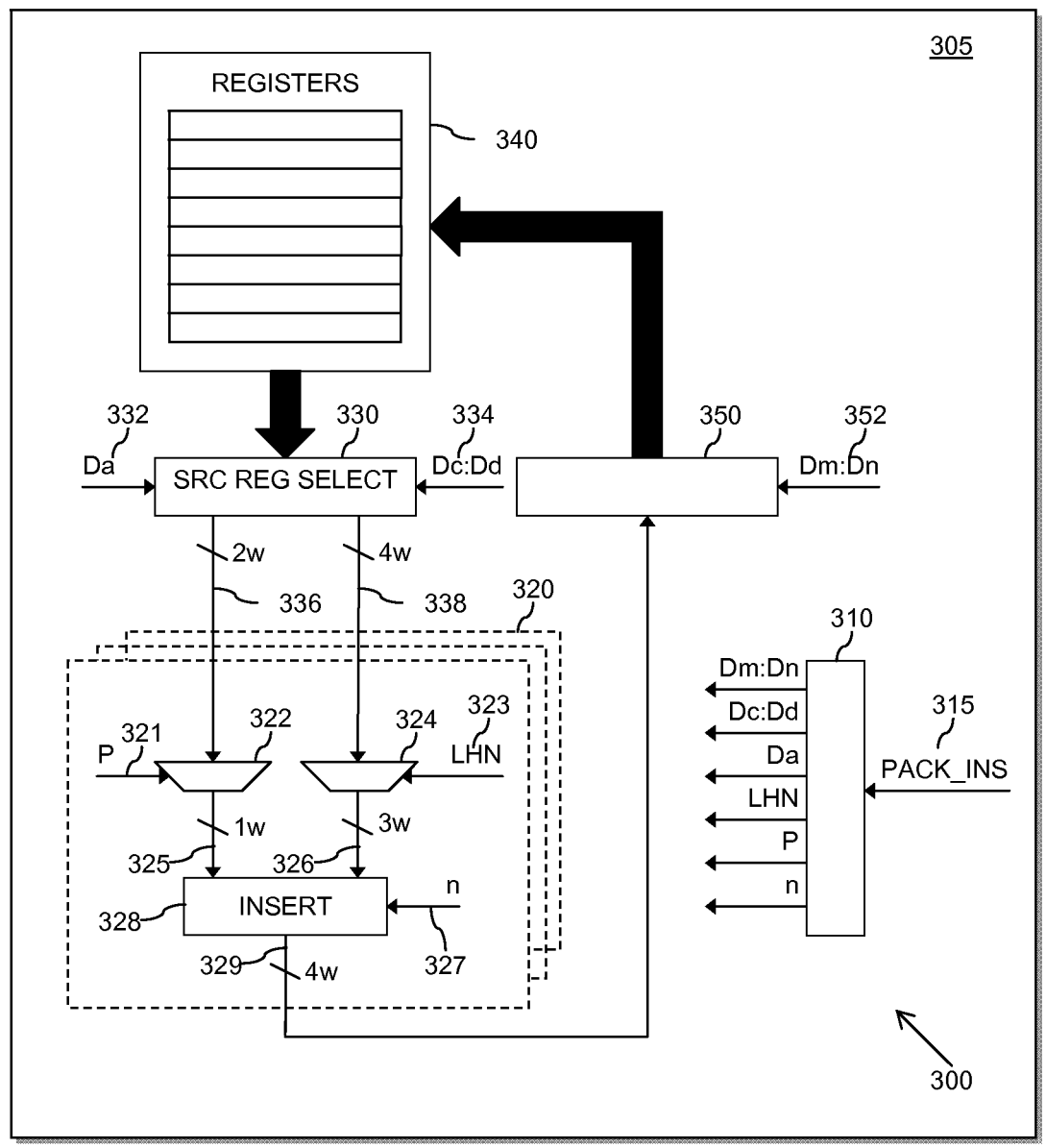
FIG. 3 illustrates a simplified block diagram of an example of a part of a signal processing device.

Referring now to FIG. 3, there is illustrated a simplified block diagram of an example of a part of a signal processing device 300. The signal processing device 300 in the illustrated example is implemented within an integrated circuit device 305 comprising at least one die within a single integrated circuit package, and may comprise, for example a digital signal processor (DSP), microprocessor, microcontroller, or other such signal processing device comprising one or more processing cores.

In the illustrated example, the signal processing device 300 comprises one or more control units 310 arranged to receive instructions to be executed, decode the received instructions and output control signals for other components of the signal processing device 300 in accordance with the received instructions. In particular in the illustrated example, at least one control unit 310 of the signal processing device 300 is arranged to receive and decode a pack-insert instruction 315 and output control signals in accordance with the received pack-insert instruction 315. A generic syntax for one example of such a pack-insert instruction 315 comprises:

PACK.INSn.p3.4W Da.P, Dc:Dd,Dm:Dn

In this example of a generic form of a pack-insert instruction 315, the instruction comprises an operand PACK.INS (in human readable form) identifying the instruction as a pack-insert instruction. The example pack-instruction 315 further comprises the following fields:

- an insert location field n that defines a location within a sequence of data blocks to be output to a destination register at which a first data block is to be inserted;
- a pack data identifier field p3 that defines a location within a received source register value comprising data to be packed around the first data block within the sequence of data blocks to be output;
- a data manipulation size field 4W, which in the illustrated example defines a 4-word data manipulation size;
- an insert data block source register address field Da that defines an address of a source register containing the first data block to be inserted within the sequence of data blocks to be output;
- an insert data block identifier field P that defines a location within a received source register value comprising the first data block to be inserted into the sequence of data blocks to be output;
- a pack data source register address field Dc:Dd that defines an address of the or each source register(s) containing the data blocks to be packed around the first data block within the sequence of data blocks to be output; and
- a destination register address field Dm:Dn that defines an address of the or each destination register to which the sequence of data blocks is to be output.

The pack-insert instruction 315 of the illustrated example is arranged to cause, upon execution thereof, a first data block within a first source register (Da) to be inserted into a sequence of data blocks to be output to a destination register, and to pack a plurality of further data blocks to be packed around the first data block within the sequence of data blocks to be output to the destination register. In the illustrated example, the plurality of data blocks to be packed around the first data block are received from one or more different source register(s) (Dc:Dd) with respect to the first data block.

A data block may comprise any appropriate size, and in the illustrated example described below with reference to the accompanying drawings comprises two bytes (one word) of data. However, it is contemplated that a data block as herein referred to may comprise alternative data sizes, for example a single byte (e.g. 8-bits) or a plurality of words.

The signal processing device 300 comprises one or more pack-insert components 320. The pack-insert component(s) 320 may form a part of one or more arithmetic logic units (ALUs) of the signal processing device 300. The (or each) pack-insert component 320 is arranged to receive at least a first data block to be inserted into a sequence of data blocks to be output to at least one destination register. The (or each) pack-insert component 320 is further arranged to receive a plurality of further data blocks to be packed around the at least first data block within the sequence of data blocks to be output to the at least one destination register.

In the illustrated example, the signal processing device 300 comprises at least one source register select component 330 arranged to selectively couple the (or each) pack-insert component 320 to source registers, for example within a register file 340 in the illustrated example, in accordance with an insert data block source register address control signal Da 332 and a pack data source register address control signal Dc:Dd 334. The (or each) pack-insert component 330 is arranged to receive the at least first data block and the plurality of further data blocks from the source register selectively coupled thereto by the at least one source register select component 320.

In the illustrated example, the (or each) pack-insert component 320 is arranged to receive at least a part of a first (insert) source register value 336 from a first source register corresponding to the first source register address Da, comprising the first data block to be inserted into the sequence of data blocks. In the illustrated example, the first source register value 336 comprises a two word (e.g. 16-bit) value. The (or each) pack-insert component 320 is further arranged to receive an insert data block identifier control signal P 321 identifying at least one location within the received (at least part of) first source register value 336 comprising the first data block, and to selectively extract the first data block from the received (at least part of) first source register value 336 based at least partly on the insert data block identifier control signal P 321.

For example, and as illustrated in FIG. 3, the (or each) pack-insert component 320 may comprise a first multiplexer component 322 arranged to receive at a data input thereof the first source register value 336, and at a control input thereof the insert data block identifier control signal P 321, and to output the first data block 325 from the received first source register value 336 based at least partly on the insert data block identifier control signal P 321. In the manner, the first multiplexer component 322 is controllable to selectively extract the first data block from the received (at least part of) first source register value 336 based at least partly on the insert data block identifier control signal P 321.

In the illustrated example, the (or each) pack-insert component 320 is further arranged to receive at least a part of a second (pack data) source register value 338 from at least a second source register corresponding to the second, pack data source register address Dc:Dd 334, comprising the further data blocks to be packed around the first data bloc within the sequence of data blocks to be output. In the illustrated example, the second source register value 338 comprises a four word (e.g. 32-bit) value. The (or each) pack-insert component 320 is further arranged to receive a pack data identifier field P3 323 identifying at least one location within the received second source register value 338 comprising the plurality of further (pack) data blocks, and to selectively extract the plurality of further data blocks from the received (at least part of) second source register value 338 based at least partly on the pack data identifier field P3 323.

For example, and as illustrated in FIG. 3, the (or each) pack-insert component 320 may comprise a second multiplexer component 324 arranged to receive at a data input thereof the second source register value 338, and at a control input thereof the pack data identifier field P3 323, and to output the plurality of further data blocks 326 from the received second source register value 338 based at least partly on the pack data identifier field P3 323. In this manner, the second multiplexer component 324 is controllable to selectively extract the plurality of further data blocks from the received (at least part of) second source register value 338 based at least partly on the pack data identifier field P3 323. In the illustrated example, three further data blocks 326 are extracted from the second source register value 338, each comprising one word (e.g. 8-bits).

Having extracted the first data block 325 and plurality of further data blocks 326, the (or each) pack-insert component 320 then arranges the extracted data blocks into a sequence of data blocks based to be output to a destination register. In the illustrated example, the (or each) pack-insert component 320 is arranged to receive an insert location control signal n 327 identifying at least one location within the sequence of data blocks to be output at which the first data block 325 is to be inserted. The (or each) pack-insert component 320 is further arranged to arrange the first data block 325 and the plurality of further data blocks 326 into a sequence of data blocks such that the first data block 325 is located within the sequence of data blocks in accordance with the insert location control signal n 327.

For example, and as illustrated in FIG. 3, the (or each) pack-insert component 320 may comprise a data block arrangement component 328 arranged to receive the first data block 325, the plurality of further data blocks 326 and the insert location control signal n 327, and to arrange the first data block 325 and the plurality of further data blocks 326 into a sequence of data blocks such that the first data block 325 is located within the sequence of data blocks in accordance with the insert location control signal n 327. In some examples, the data block arrangement component 328 may be compromised of a 4:1 multiplexer arranged to insert the first word in the specified location according to n, and three 2:1 multiplexers controlled by the control signal n.

The data block arrangement component 328 then outputs the sequence of data blocks 329 to a destination register. In the illustrated example, the signal processing device 300 further comprises at least one destination register select component 352 arranged to selectively couple the (or each) pack-insert component 320 to at least one destination register, for example within the register file 340 in the illustrated example, in accordance with a destination register address control signal. The (or each) pack-insert component 320 is thus arranged to output the sequence of data blocks 329 to the destination register selectively coupled thereto by the destination register select component 350.

Thus, in the example of a generic form of a pack-insert instruction 315 provided above, PACK.INSn.p3.4W packs a single 16-bit word from the insert data block source register address field Da with either three high 16-bit words of the pack data source register address field Dc:Dd (H3 variants take Dc.H, Dc.L and Dd.H while L3 variants take Dc.L, Dd.H and Dd.L). In some examples, the first source word is inserted before the first of the three words for INS0 variants, inserted before the second of the three words for INS1 variants, inserted before the third of the three words for INS2 variants and inserted after the third of the three words for INS3 variants. The first word may be taken from either the high part or the low part of the first source register.

Figure 4:
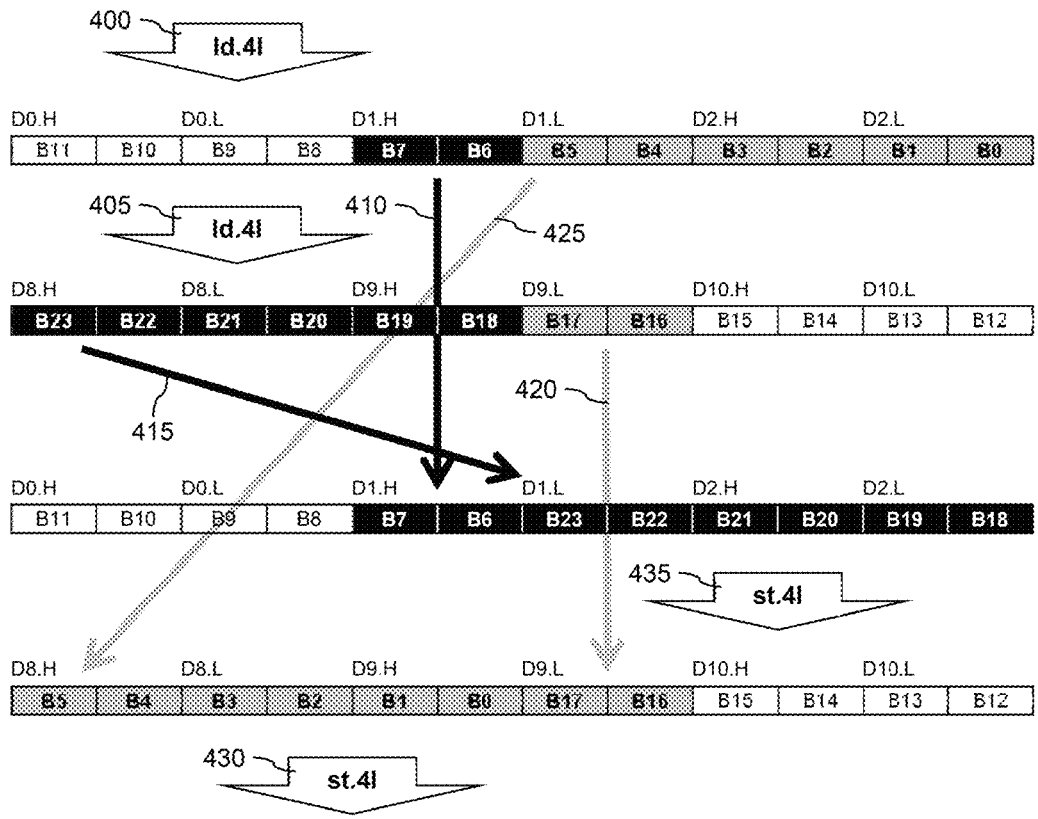
FIG. 4 illustrates an example of performing an LTE (Long Term Evolution) channel interleaving (Qm=6) procedure using a pack-insert instruction.

FIG. 4 illustrates an example of performing an LTE (Long Term Evolution) channel interleaving (Qm=6) procedure using the pack-insert instruction and pack-insert component 300 illustrated in FIG. 315. An example of the corresponding instructions is provided below:

ld.4l (r0)+,d0:d3; load 16 bytes (4 longs) from A
ld.4l (r1)+,d8:d11; load 16 bytes from B
pack.ins3.l3.4w d9.l,d1:d2,d8:d9
pack.ins0.h3.4w d1.h,d8:d9,d1:d2
st.4l d0:d3,(r2)+; store 16 bytes to dest0
st.4l d8:d11,(r3)+; store 16 bytes to dest1

Figure 2:
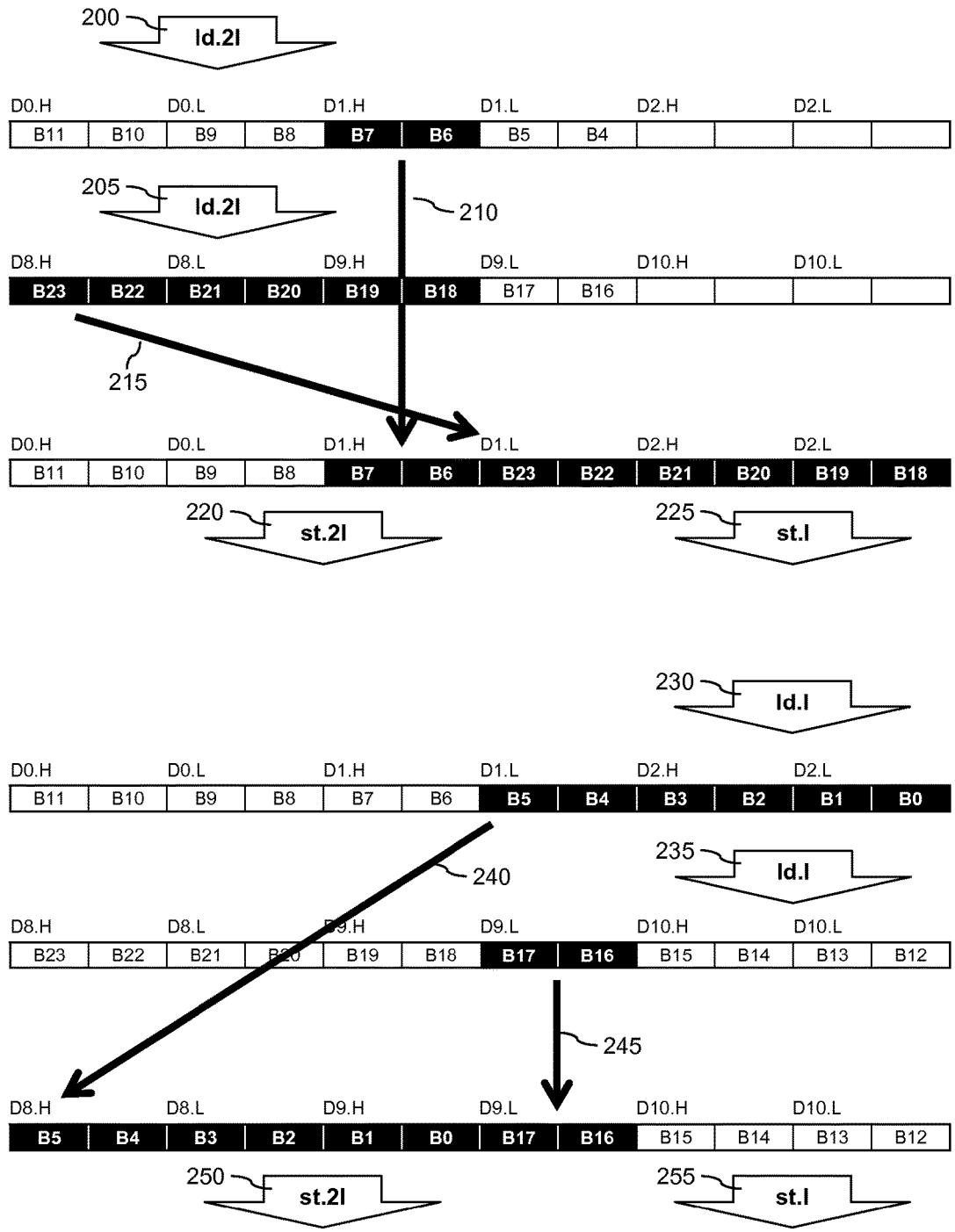
FIG. 2 illustrates an example of performing an LTE (Long Term Evolution) channel interleaving (Qm=6) procedure using conventional pack instructions.

In this example interleaving procedure, only a single "insert and pack" operation is required to be performed. This is in contrast to using conventional pack, insert-extract and permute instructions for performing the same interleaving procedure, which require two "insert and pack" operations, as illustrated in FIG. 2. The procedure illustrated in FIG. 4 starts with two load instructions for loading data into source registers, as illustrated at 400 and 405. For the example illustrated in FIG. 4, each load instruction loads 16 bytes (4 longs) into source registers; as opposed to the load instructions used in the conventional example of FIG. 2 which only load 8 bytes into source registers. Two separate 'pack-insert' instructions are then executed.

The first pack-insert instruction inserts a first data block into the destination registers, as illustrated at 410, and also packs a plurality of further data blocks into the destination register after the first data block, as illustrated at 415. In the example pack-insert instructions used within the instructions provided above for performing the interleaving procedure, pack-insert instructions comprise a further field indicating where in the identified destination register the sequence of data blocks comprising the first data block and plurality of further data blocks is to be located. For the first pack-insert instruction:

pack.ins3.l3.4w d9.l,d1:d2,d8:d9, this additional field comprises an l value, indicating that the first data block is taken from the 'high' part of the insert data block source register.

The second pack-insert instruction inserts a second data block into the destination registers, as illustrated at 420, and also packs a plurality of further data blocks into the destination register after the second data block, as illustrated at 425. For this second pack-insert instruction:

pack.ins0.h3.4w d1.h,d8:d9,d1:d2, this additional field comprises an h value, indicating that the first data block is taken from the 'low' part of the insert data block source register.

Two store instructions are then executed to store the content of the destination registers, as illustrated at 430 and 435.

As can be seen from FIGS. 2 and 4, the pack-insert instruction enables the example LTE (Long Term Evolution) channel interleaving (Qm=6) procedure to be performed using significantly fewer instructions than is possible using conventional pack, insert-extract and permute instructions.

Advantageously, the proposed pack-insert instruction not only flexibly combines insertion and packing of data blocks within a single instruction, but also enables the use of wide load and store instructions, as opposed to the need to use multiple loads and stores in the conventional implementation.

In particular, for a particular scenario using conventional pack, insert-extract and permute instructions typically requires 15 cycles (24 load, 6 store) per 12 elements (each element comprising 6 bytes/3 words), and 300 MCPS (million cycles per second). In contrast, for the same scenario, using the pack-insert instruction disclosed herein only requires 5 cycles (8 load, 2 stores) per 12 elements, and 100 MCPS.

Advantageously, the pack-insert instruction may be implemented using existing data paths within a signal processing device. For example, referring back to FIG. 3, the pack-insert component 320 may utilise multiplexers etc. required for standard SIMD (single instruction multiple data) pack instructions. Accordingly, the pack-insert instruction may be implemented with substantially no increase to the complexity of the signal processing device 300.

Figure 5:
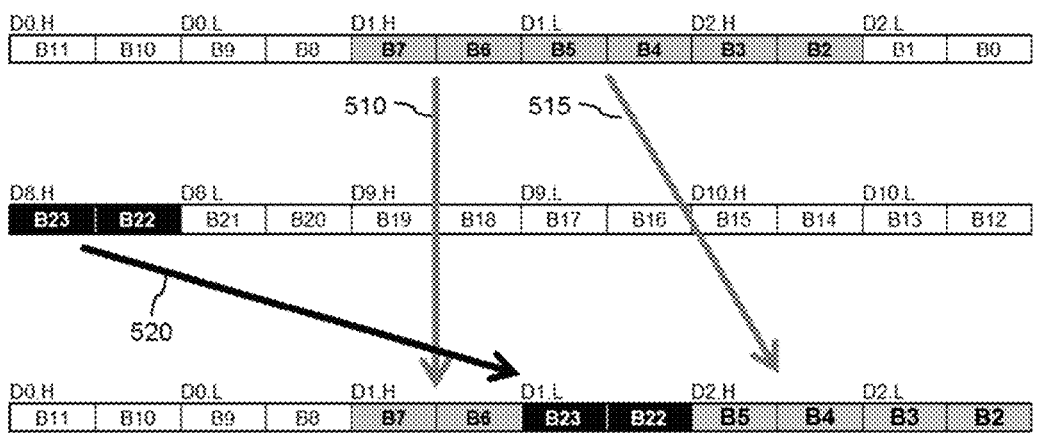
FIG. 5 illustrates an example of performing insertion of rank information in communication standards such as LTE/LTE-A, WCDMA and/or WiMAX using a pack-insert instruction.

FIG. 5 illustrates an example of performing insertion of rank information in communication standards such as LTE/LTE-A, WCDMA and/or WiMAX using the pack-insert instruction and pack-insert component 300 illustrated in FIG. 315. In particular, FIG. 5 illustrates an implementation of the pack-insert instruction:

PACK.INS1.H3.4W D8.H,D1:D2,D1:D2

In the example illustrated in FIG. 5, the pack-insert instruction inserts a first data block comprising a 16-bit data word from a 'high' part of the insert data block source register D8. The pack-insert instruction of FIG. 5 comprises an INS1 variant, and so the first data block is inserted before the second of three pack words. In addition, since the pack-insert instruction of FIG. 5 comprises an H3 variant, the pack data blocks are taken from D1.H, D1.L and D2.H. The arranged data blocks are then output to the destination register pair D1:D2.

Table 1 below provides an example of a pack-insert instruction family comprising examples of a pack-insert instruction for packing and inserting one data block (word) within three consecutive data blocks (words):

TABLE 1

| Syntax | Operation |
|---|---|
| PACK.INS0.H3.4W Da.H,Dc:Dd,Dm:Dn | Dm.H = Da.H; |
| | Dm.L = Dc.H; |
| | Dn.H = Dc.L; |
| | Dn.L = Dd.H; |
| PACK.INS0.H3.4W Da.L,Dc:Dd,Dm:Dn | Dm.H = Da.L; |
| | Dm.L = Dc.H; |
| | Dn.H = Dc.L; |
| | Dn.L = Dd.H; |
| PACK.INS1.H3.4W Da.H,Dc:Dd,Dm:Dn | Dm.H = Dc.H; |
| | Dm.L = Da.H; |
| | Dn.H = Dc.L; |
| | Dn.L = Dd.H; |
| PACK.INS1.H3.4W Da.L,Dc:Dd,Dm:Dn; | Dm.H = Dc.H |
| | Dm.L = Da.L; |
| | Dn.H = Dc.L; |
| | Dn.L = Dd.H; |
| PACK.INS2.H3.4W Da.H,Dc:Dd,Dm:Dn | Dm.H = Dc.H; |
| | Dm.L = Dc.L; |
| | Dn.H = Da.H; |
| | Dn.L = Dd.H; |
| PACK.INS2.H3.4W Da.L,Dc:Dd,Dm:Dn | Dm.H = Dc.H; |
| | Dm.L = Dc.L; |
| | Dn.H = Da.L; |
| | Dn.L = Dd.H; |

TABLE 1-continued

| Syntax | Operation |
|---|---|
| PACK.INS3.H3.4W Da.H,Dc:Dd,Dm:Dn | Dm.H = Dc.H; |
| | Dm.L = Dc.L; |
| | Dn.H = Dd.H; |
| | Dn.L = Da.H; |
| PACK.INS3.H3.4W Da.L,Dc:Dd,Dm:Dn | Dm.H = Dc.H; |
| | Dm.L = Dc.L; |
| | Dn.H = Dd.H; |
| | Dn.L = Da.L; |
| PACK.INS0.L3.4W Da.H,Dc:Dd,Dm:Dn | Dm.H = Da.H; |
| | Dm.L = Dc.L; |
| | Dn.H = Dd.H; |
| | Dn.L = Dd.L; |
| PACK.INS0.L3.4W Da.L,Dc:Dd,Dm:Dn | Dm.H = Da.L; |
| | Dm.L = Dc.L; |
| | Dn.H = Dd.H; |
| | Dn.L = Dd.L; |
| PACK.INS1.L3.4W Da.H,Dc:Dd,Dm:Dn | Dm.H = Dc.L; |
| | Dm.L = Da.H; |
| | Dn.H = Dd.H; |
| | Dn.L = Dd.L; |
| PACK.INS1.L3.4W Da.L,Dc:Dd,Dm:Dn; | Dm.H = Dc.L |
| | Dm.L = Da.L; |
| | Dn.H = Dd.H; |
| | Dn.L = Dd.L; |
| PACK.INS2.L3.4W Da.H,Dc:Dd,Dm:Dn | Dm.H = Dc.L; |
| | Dm.L = Dd.H; |
| | Dn.H = Da.H; |
| | Dn.L = Dd.L; |
| PACK.INS2.L3.4W Da.L,Dc:Dd,Dm:Dn; | Dm.H = Dc.L |
| | Dm.L = Dd.H; |
| | Dn.H = Da.L; |
| | Dn.L = Dd.L; |
| PACK.INS3.L3.4W Da.H,Dc:Dd,Dm:Dn | Dm.H = Dc.L; |
| | Dm.L = Dd.H; |
| | Dn.H = Dd.L;; |
| | Dn.L = Da.H; |
| PACK.INS3.L3.4W Da.L,Dc:Dd,Dm:Dn; | Dm.H = Dc.L |
| | Dm.L = Dd.H; |
| | Dn.H = Dd.L; |
| | Dn.L = Da.L; |

Figure 6:
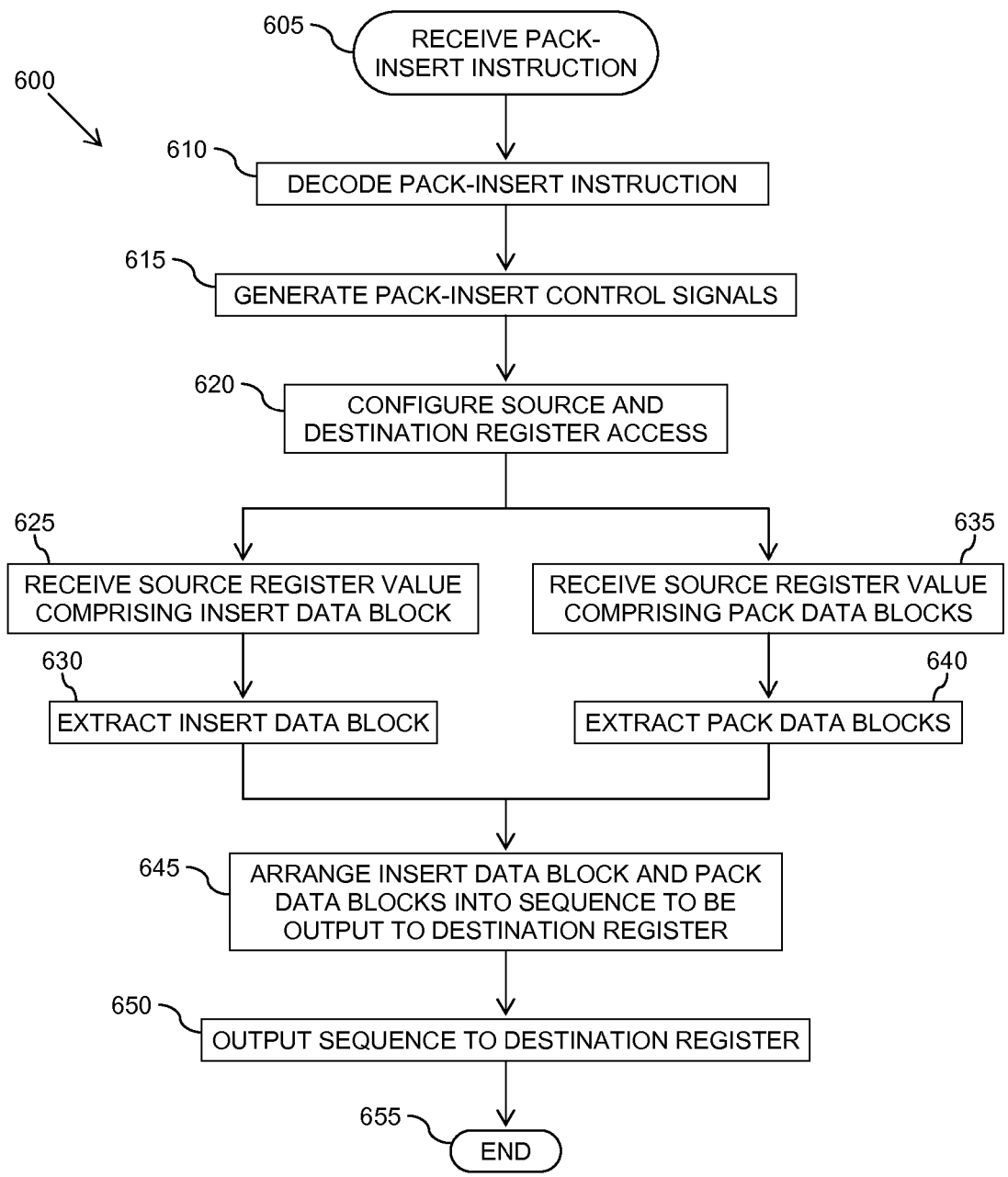
FIG. 6 illustrates a simplified flowchart of an example of a method of performing a pack-insert operation within a signal processing device.

Referring now to FIG. 6, there is illustrated a simplified flowchart of an example of a method of performing a pack-insert operation within a signal processing device, such as may be implemented within the signal processing device 300 of FIG. 3. The method starts at 605 with the receipt of a pack-insert instruction. The received pack-insert instruction is then decoded, at 610, and one or more pack-insert control signals are generated at 615. Access to one or more source register(s) and one or more destination register(s) is then configured, at 620.

In the illustrated example, a source register value is received from at least one source register comprising at least a first data block to be inserted into a sequence of data blocks to be output to at least one destination register, at 625, and the at least first data block is extracted from the source register value at 630. Additionally, a further source register value is received from at least one source register comprising a plurality of further data blocks to be packed within the sequence of data blocks to be output to the at least one destination register, at 635, and the plurality of further data blocks are extracted from the further source register value at 640.

In the illustrated example, the method then comprises arranging the at least first data block and the plurality of further data blocks into a sequence of data blocks based at least partly on at least one pack-insert control signal, at 645. The sequence of data blocks is then output to one or more destination registers, at 650, and the method ends at 655.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A signal processing device comprising:
a control unit arranged to
  receive a pack-insert instruction,
  decode the received pack-insert instruction, and
  output at least one pack-insert control signal in accordance with the received pack-insert instruction;
at least one pack-insert component arranged to, in response to the pack-insert instruction, in which the pack-insert instruction is a single instruction:
  receive a first data block to be inserted into a sequence of data blocks to be output to at least one destination register,
  receive a plurality of further data blocks to be packed within the sequence of data blocks to be output to the at least one destination register, the plurality of further data blocks including a second data block and a third data block, the second data block and the third data block stored at distinct locations from each other and the first data block,
  arrange the first data block and the plurality of further data blocks including the second data block and the third data block into a sequence of data blocks based at least partly on the at least one pack-insert control signal, wherein the at least one pack-insert control signal includes an insert location signal identifying a location within the sequence of data blocks at which the first data block is to be inserted, wherein when the insert location signal has a first value, the first data block is arranged to be between the second data block and the third data block in the sequence of data blocks, and output the sequence of data blocks.

2. The signal processing device of claim 1, wherein the plurality of further data blocks includes a fourth data block, wherein when the insert location signal has a second value, the first data block is arranged to be between the third data block and the fourth data block in the sequence of data blocks.

3. The signal processing device of claim 1, wherein the at least one pack-insert component is arranged to:
receive at least a part of at least one source register value comprising the first data block to be inserted into the sequence of data blocks to be output to the at least one destination register; and
selectively extract the first data block from the received at least part of the at least one source register value based at least partly on the received at least one pack-insert control signal.

4. The signal processing device of claim 3, wherein
the at least one pack-insert control signal comprises at least one insert data block identifier signal identifying at least one location within the received at least part of the at least one source register value comprising the first data block, and
the at least one pack-insert component is arranged to selectively extract the first data block from the received at least part of the at least one source register value comprising the first data block based at least partly on the at least one insert data block identifier signal.

5. The signal processing device of claim 1, wherein the at least one pack-insert component is arranged to:
receive at least a part of at least one source register value comprising the plurality of further data blocks to be packed within the sequence of data blocks to be output to the at least one destination register; and
selectively extract the plurality of further data blocks from the received at least part of the at least one source register value based at least partly on the received at least one pack-insert control signal.

6. The signal processing device of claim 5, wherein
the at least one pack-insert control signal comprises at least one pack data identifier signal that identifies at least one location within the received at least part of the at least one source value comprising the plurality of further data blocks from which the plurality of further data blocks are to be extracted, and
the at least one pack-insert component is arranged to selectively extract the plurality of further data blocks from the received at least part of the at least one source register value comprising the plurality of further data blocks based at least partly on the at least one pack data identifier signal.

7. The signal processing device of claim 1, wherein the signal processing device further comprises:
at least one source register select component arranged to selectively couple the at least one pack-insert component to at least one source register in accordance with the at least one pack-insert control signal, wherein the at least one pack-insert component is arranged to receive the first data block and the plurality of further data blocks from the at least one source register selectively coupled thereto by the at least one source register select component.

8. The signal processing device of claim 1, wherein the signal processing device further comprises:
at least one destination register select component arranged to selectively couple the at least one pack-insert component to at least one destination register in accordance with the at least one pack-insert control signal, wherein the at least one pack-insert component is arranged to output the sequence of data blocks to the at least one destination register selectively coupled thereto by the at least one destination register select component.

9. The signal processing device of claim 1, wherein the control unit is arranged to receive and decode the pack-insert instruction comprising at least one value from a group comprising of:
at least one insert location field;
at least one insert data block identifier field;
at least one pack data identifier field;
at least one insert data block source register address field;
at least one pack data source register address field; and
at least one destination register address field,
wherein the control unit is further arranged, upon decoding of the pack-insert instruction, to output the at least one pack-insert control signal comprising at least one of:
at least one insert location control signal;
at least one insert data block identifier control signal;
at least one pack data identifier control signal;
at least one insert data block source register address control signal;
at least one pack data source register address control signal; and
at least one destination register address control signal.

10. The signal processing device of claim 1, wherein the first block of data comprises one of:
a byte of data; and
a word comprising at least two bytes of data.

11. The signal processing device of claim 1 implemented within an integrated circuit device comprising at least one die within a single integrated circuit package.

12. The signal processing device of claim 1, wherein the first data block, the second data block and the third data block include different sets of data.

13. The signal processing device of claim 1, wherein the first data block, the second data block and the third data block are received from different respective registers.

14. The signal processing device of claim 1, wherein the first data block, the second data block and the third data block are associated with different data streams.

15. The signal processing device of claim 1, wherein the first data block, the second data block and the third data block are received from different memory locations.

16. A method of performing a pack-insert operation within a signal processing device, the method comprising:
decoding a single pack-insert instruction;
in response to decoding the single pack-insert instruction, the method further comprises:
outputting at least one pack-insert control signal;
receiving a first data block to be inserted into a sequence of data blocks to be output to at least one destination register in response to the at least one pack-insert control signal;

receiving a plurality of further data blocks from respective locations distinct from a location of the first data block, the plurality of further data blocks to be packed within the sequence of data blocks to be output to the at least one destination register in response to the at least one pack-insert control signal;

arranging the first data block and the plurality of further data blocks into a sequence of data blocks based on the at least one pack-insert control signal, wherein the at least one pack-insert control signal includes an insert location signal identifying a location within the sequence of data blocks at which the first data block is to be inserted, wherein when the insert location signal has a first value, the first data block is arranged to be between the second data block and the third data block in the sequence of data blocks; and outputting the sequence of data blocks.

\* \* \* \* \*